(12) United States Patent
Farnsworth et al.

(10) Patent No.: US 7,957,134 B2
(45) Date of Patent: Jun. 7, 2011

(54) SYSTEM AND METHOD HAVING EVAPORATIVE COOLING FOR MEMORY

(75) Inventors: Arthur K. Farnsworth, Houston, TX (US); Shailesh N. Joshi, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 266 days.

(21) Appl. No.: 11/784,793

(22) Filed: Apr. 10, 2007

(65) Prior Publication Data

US 2008/0251911 A1    Oct. 16, 2008

(51) Int. Cl.
    *H05K 7/20* (2006.01)
(52) U.S. Cl. ......... 361/679.54; 361/679.52; 361/679.46; 361/709; 361/711; 257/719
(58) Field of Classification Search .................. 361/687, 361/679.54, 679.52, 679.46, 709, 711; 257/719
    See application file for complete search history.

(56) References Cited

U.S. PATENT DOCUMENTS

| | | | |
|---|---|---|---|
| 5,109,318 A * | 4/1992 | Funari et al. ................... | 361/710 |
| 5,268,812 A | 12/1993 | Conte | |
| 5,313,097 A * | 5/1994 | Haj-Ali-Ahmadi et al. .. | 257/706 |
| 5,355,942 A | 10/1994 | Conte | |
| 5,644,161 A * | 7/1997 | Burns ........................... | 257/668 |
| 5,661,339 A * | 8/1997 | Clayton ........................ | 257/678 |
| 5,708,297 A * | 1/1998 | Clayton ........................ | 257/723 |
| 5,751,553 A * | 5/1998 | Clayton ........................ | 361/749 |
| 5,892,660 A * | 4/1999 | Farnworth et al. ............. | 361/728 |
| 5,966,287 A * | 10/1999 | Lofland et al. ................ | 361/704 |
| 6,031,727 A * | 2/2000 | Duesman et al. ............. | 361/761 |
| 6,119,765 A * | 9/2000 | Lee ................................ | 165/80.3 |
| 6,232,659 B1 * | 5/2001 | Clayton ........................ | 257/724 |
| 6,233,150 B1 * | 5/2001 | Lin et al. ....................... | 361/704 |
| 6,353,538 B1 * | 3/2002 | Ali et al. ........................ | 361/728 |
| 6,362,966 B1 * | 3/2002 | Ali et al. ........................ | 361/728 |
| 6,377,460 B1 * | 4/2002 | Pohl et al. ..................... | 361/704 |
| 6,424,528 B1 | 7/2002 | Chao | |
| 6,424,532 B2 * | 7/2002 | Kawamura .................... | 361/708 |
| 6,437,437 B1 | 8/2002 | Zuo et al. | |
| 6,449,156 B1 * | 9/2002 | Han et al. ...................... | 361/704 |
| 6,525,420 B2 | 2/2003 | Zuo et al. | |
| 6,611,057 B2 | 8/2003 | Mikubo et al. | |
| 6,760,222 B1 | 7/2004 | Wang | |
| 6,765,797 B2 * | 7/2004 | Summers et al. ............. | 361/704 |
| 6,775,139 B2 * | 8/2004 | Hsueh ........................... | 361/697 |
| 6,858,929 B2 | 2/2005 | Zuo et al. | |
| 6,862,185 B2 | 3/2005 | Morris | |
| 6,888,719 B1 * | 5/2005 | Janzen et al. ................. | 361/687 |
| 6,896,039 B2 | 5/2005 | Dussinger et al. | |
| 7,005,738 B2 | 2/2006 | Zuo et al. | |
| 7,007,741 B2 | 3/2006 | Sen et al. | |
| 7,023,700 B2 * | 4/2006 | Chiou et al. ................... | 361/704 |
| 7,079,396 B2 * | 7/2006 | Gates et al. ................... | 361/719 |
| 7,100,680 B2 | 9/2006 | Dussinger et al. | |
| 7,106,595 B2 | 9/2006 | Foster, Sr. et al. | |
| 7,151,668 B1 * | 12/2006 | Stathakis ...................... | 361/700 |

(Continued)

*Primary Examiner* — Anatoly Vortman

(57) ABSTRACT

A system, in one embodiment, may include an in-line memory module with a plurality of memory circuits disposed on a circuit board, wherein the circuit board may have an edge connector with a plurality of contact pads. The system also may include a heat spreader disposed along the plurality of memory circuits. Finally, the system may include a heat pipe, a vapor chamber, or a combination thereof, extending along the heat spreader. In another embodiment, a system may include a heat spreader configured to mount to an in-line memory module, and an evaporative cooling system at least substantially contained within dimensions of the heat spreader.

20 Claims, 7 Drawing Sheets

U.S. PATENT DOCUMENTS

| | | | |
|---|---|---|---|
| 7,187,552 B1* | 3/2007 | Stewart et al. | 361/704 |
| 7,215,551 B2* | 5/2007 | Wang et al. | 361/707 |
| 7,345,882 B2* | 3/2008 | Lee et al. | 361/710 |
| 7,349,219 B2* | 3/2008 | Lai et al. | 361/719 |
| 7,382,617 B2* | 6/2008 | Yu et al. | 361/704 |
| 7,391,613 B2* | 6/2008 | Lai et al. | 361/700 |
| 2003/0193788 A1* | 10/2003 | Farnworth et al. | 361/752 |
| 2004/0130873 A1* | 7/2004 | Hsueh | 361/697 |
| 2004/0250989 A1* | 12/2004 | Im et al. | 165/80.1 |
| 2005/0201063 A1* | 9/2005 | Lee et al. | 361/715 |
| 2005/0276021 A1* | 12/2005 | Gates et al. | 361/709 |
| 2007/0170580 A1* | 7/2007 | Baek et al. | 257/706 |
| 2007/0201208 A1* | 8/2007 | Goodwin et al. | 361/701 |
| 2007/0263359 A1* | 11/2007 | Lai et al. | 361/715 |
| 2008/0013282 A1* | 1/2008 | Hoss et al. | 361/715 |

\* cited by examiner

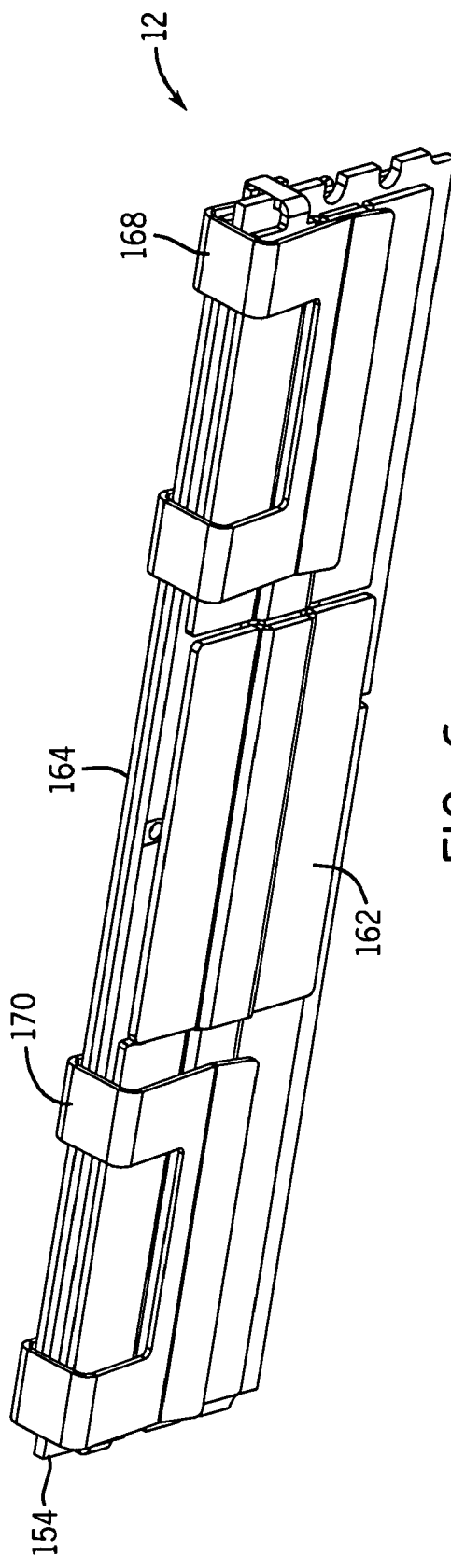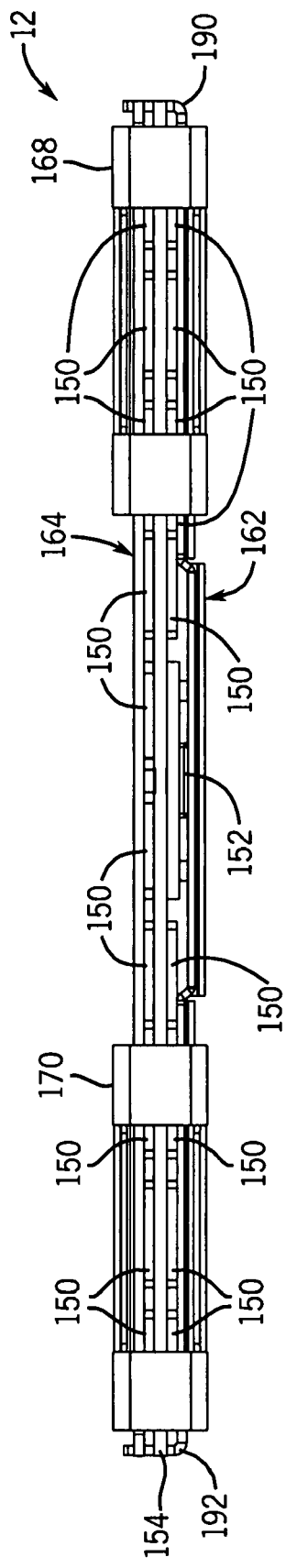

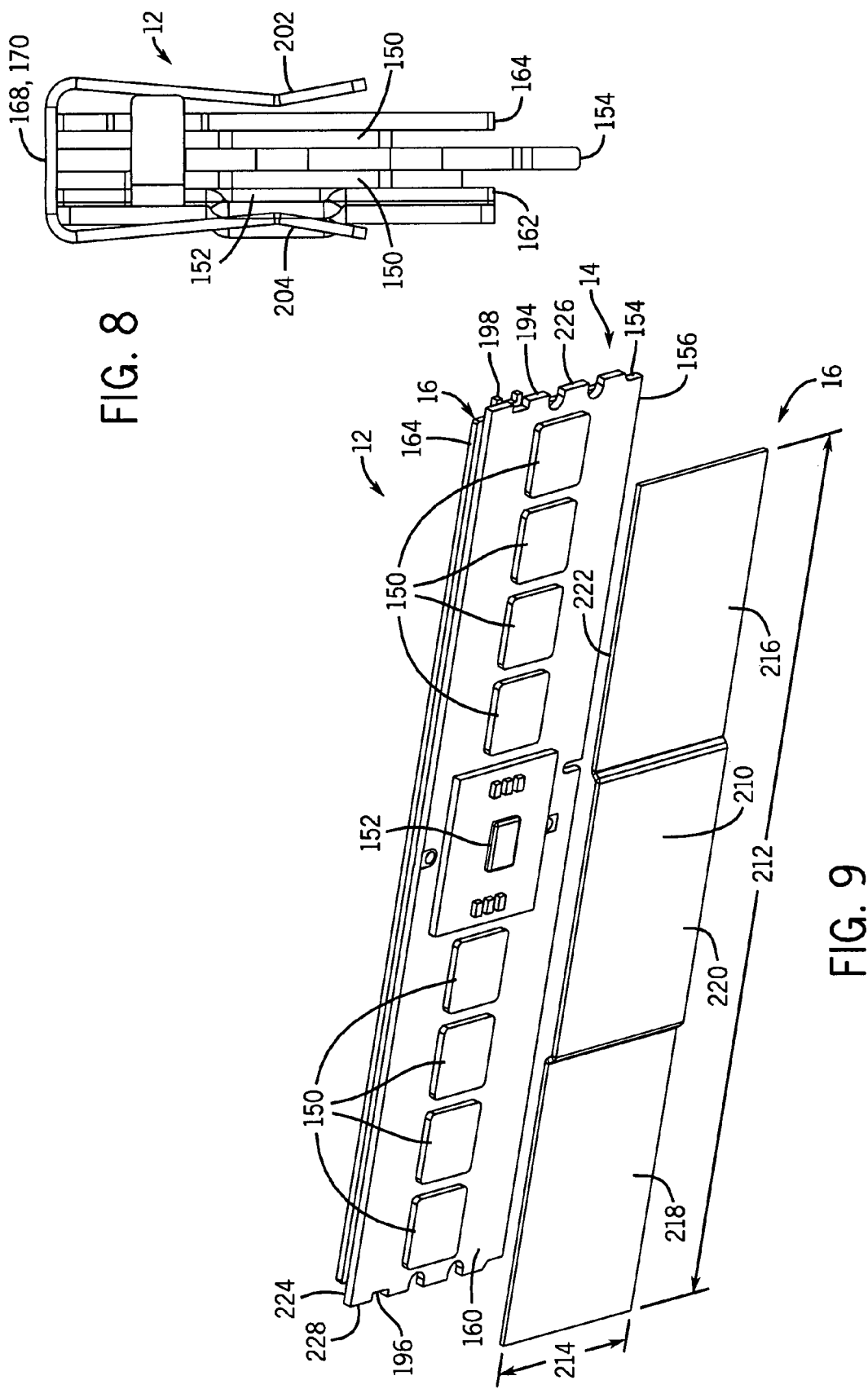

SYSTEM AND METHOD HAVING EVAPORATIVE COOLING FOR MEMORY

BACKGROUND

Computers and other electronic devices generally include memory, such as single in-line memory modules (SIMMs) or dual in-line memory modules (DIMMs). Unfortunately, the memory can generate a significant amount of heat during operation, thereby affecting the performance and life of the memory. Existing computers employ fans and other cooling solutions, which consume a considerable amount of space and/or fail to adequately cool the memory. A prevalent practice is to increase the number and flow rate of fans in a system, which unfortunately increases the acoustic noise and power consumption in the system. In addition, many cooling solutions substantially increase the normal footprint or form factor of the memory, thereby complicating the placement of the memory in certain systems (e.g., laptops, servers, etc.). In many systems, space is simply not available to accommodate these cooling solutions. For example, the cooling solution may protrude substantially above the top of a SIMM or DIMM, thereby preventing use of the memory module in a dense system, e.g., laptop or server, in which space is not available. The increasing power levels and densities of servers, laptops, and other systems also decrease the effectiveness of current cooling techniques.

BRIEF DESCRIPTION OF THE DRAWINGS

Advantages of one or more disclosed embodiments may become apparent upon reading the following detailed description and upon reference to the drawings in which:

FIG. 6 is a perspective view of the low profile in-line memory assembly with the various components coupled together in a low profile arrangement configured to fit within a normal footprint or form factor of the in-line memory module;

FIG. 7 is a top view of the low profile in-line memory assembly;

FIG. 8 is an end view of the low profile in-line memory assembly; and

FIG. 9 is an exploded perspective view of another embodiment of a low profile in-line memory assembly having a flat vapor chamber with a variable height configured to conform with varying heights of memory chips disposed along an in-line memory module.

DETAILED DESCRIPTION OF SPECIFIC EMBODIMENTS

Figure 1:
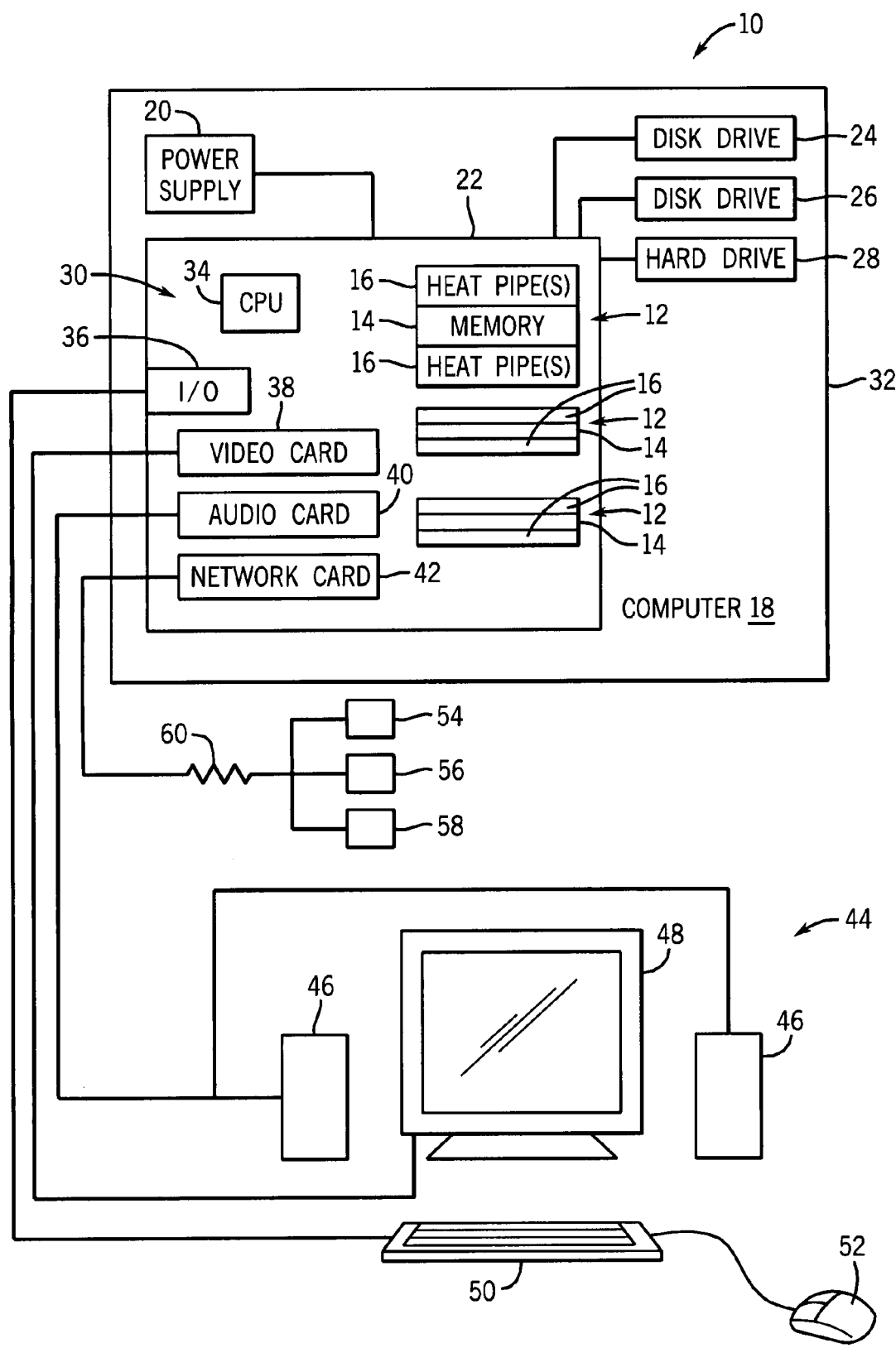
FIG. 1 is a block diagram of an embodiment of a computer system having a plurality of memory modules with one or more mounted heat pipes, vapor chambers, or a combination thereof.

FIG. 1 is a block diagram of an embodiment of a computer system 10 having one or more low profile in-line memory assemblies 12 with an evaporative cooling system configured to dissipate and/or distribute heat in a uniform manner. As illustrated, each of the memory assemblies 12 includes memory 14 and one or more evaporative cooling modules 16. Specifically, in the illustrated embodiment, the evaporative cooling modules 16 may include one or more heat pipes, one or more vapor chambers, or a combination thereof. Furthermore, the illustrated evaporative cooling module 16 may be disposed about opposite sides of the memory 14 in a sandwich-like configuration. In some embodiments, the memory 14 is an in-line memory module, such as a single in-line memory module (SIMM) or a dual in-line memory module (DIMM), having a plurality of integrated memory circuits disposed in a line along a circuit board having an edge connector. The evaporative cooling modules 16 also may include a heat spreader with the heat pipes, vapor chambers, or both, arranged flush along an inner surface of the heat spreader to contact the integrated memory circuits disposed on the circuit board. As discussed in further detail below, the illustrated evaporative cooling modules 16 have a generally low profile configuration to enable mounting within a variety of high density or compact enclosures, thereby reducing any mounting difficulties due to the incorporation of the evaporative cooling. For example, the dimensions of the memory assemblies 12 may be substantially the same or at least similar to an in-line memory module (e.g., a SIMM or a DIMM) having heat spreaders. In other words, the heat pipes, vapor chambers, or both, may be at least substantially or entirely contained within the dimensions of the heat spreader, such that no additional space is consumed within the limited space.

As further illustrated in FIG. 1, the computer system 10 includes a computer 18 having a power supply 20, a motherboard 22, optical and/or magnetic disk drives 24 and 26, a hard drive 28, and a plurality of components 30 disposed on the motherboard 22 all within a chassis 32. For example, the illustrated components 30 include a central processing unit (CPU) 34, an input/output circuit 36, a video card 38, an audio card 40, a network card 42, and the memory assemblies 12 all disposed on the motherboard 22. The illustrated computer system 10 also includes a plurality of peripherals 44 coupled to the computer 18. For example, the peripherals 44 include speakers 46 coupled to the audio card 40, a display 48 coupled to the video card 38, and a keyboard 50 and a mouse 52 coupled to the input/output circuit 36. The illustrated computer system 10 also may be coupled to other computers or devices 54, 56, and 58 via a network 60 coupled to the network card 42. Again, the low profile in-line memory assemblies 12 are mounted to the motherboard 22, wherein the mounted evaporative cooling module 16 function to dissipate heat and/or distribute heat across the memory 14. As discussed in further detail below, these memory assemblies 12 may take on a number of different forms and configurations within the scope of the presently contemplated embodiments.

Figure 2:
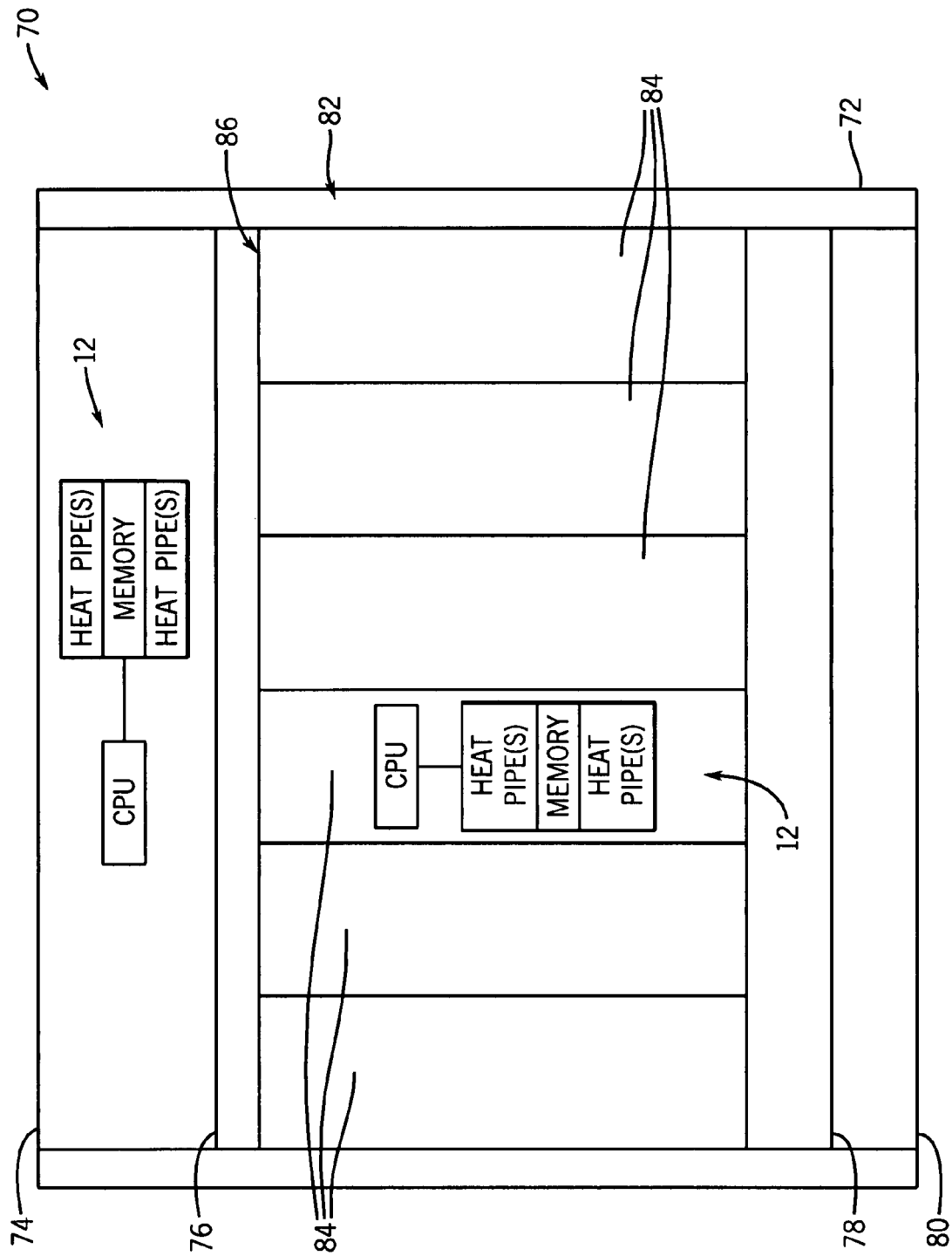
FIG. 2 is a block diagram of an embodiment of a rack system having a plurality of servers with memory modules having one or more mounted heat pipes, vapor chambers, or combination thereof.

FIG. 2 is a block diagram of a rack system 70 having a plurality of the low profile in-line memory assemblies 12 disposed in various servers mounted in a rack 72. For example, the illustrated rack 72 includes a plurality of rack mounted servers 74, 76, 78, and 80. The illustrated rack 72 also includes a rack mounted blade server system 82, which includes a plurality of blade servers 84 disposed removably within a blade enclosure 86. As illustrated, the low profile in-line memory assemblies 12 are configured to mount within the dense or compact enclosures of the servers 74, 76, 78, and 80, and also the compact or dense enclosures of the blade servers 84. Several embodiments of the low profile in-line memory assemblies 12 are now discussed with reference to FIGS. 3-9.

Figure 3:
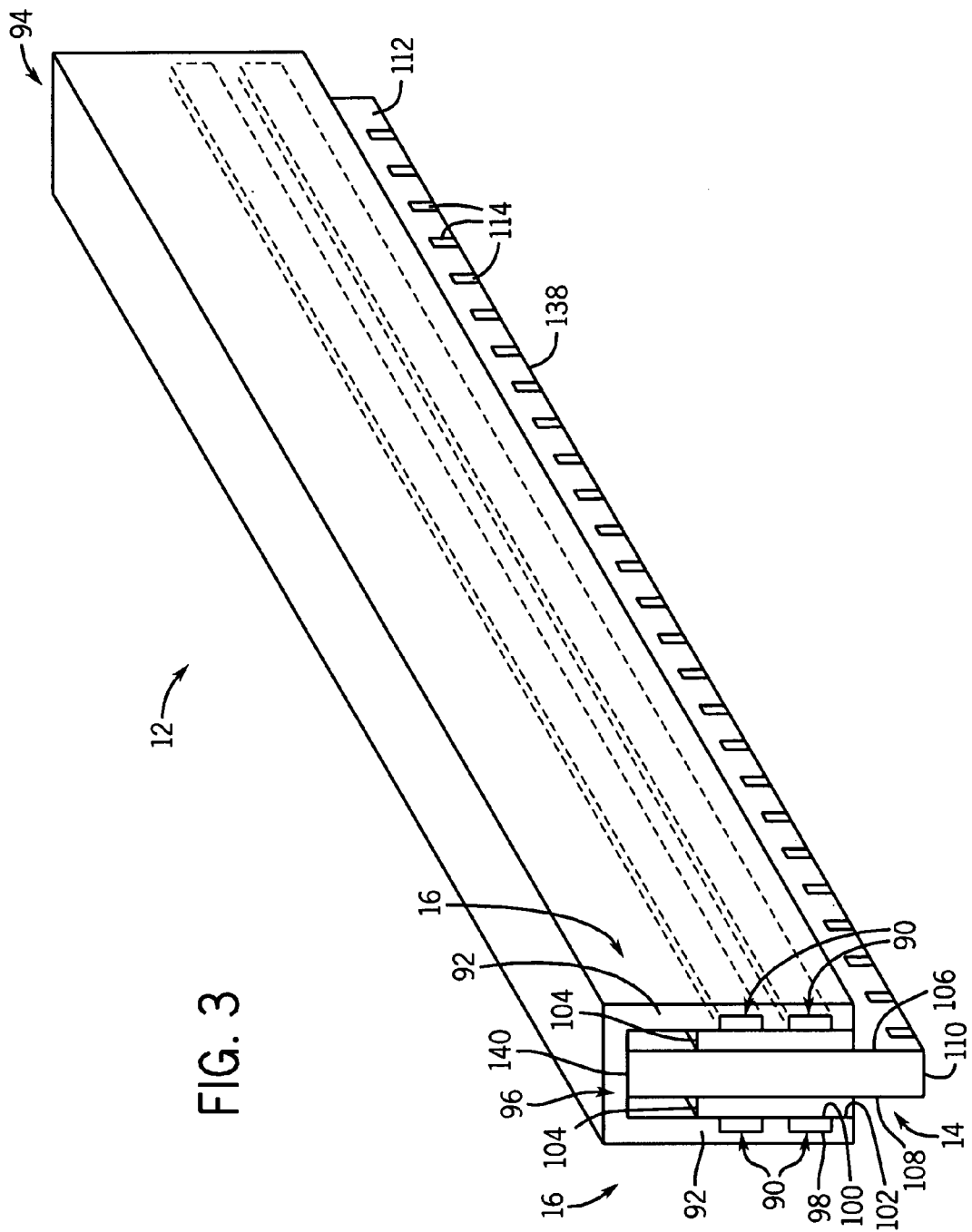
FIG. 3 is a perspective view of an embodiment of a dual in-line memory module (DIMM) having a plurality of heat pipes disposed in heat spreaders.

FIG. 3 is a perspective view of an embodiment of the memory assembly 12, wherein each of the evaporative cooling modules 16 includes a pair of heat pipes 90 disposed in a heat spreader 92. As illustrated, the heat pipes 90 are generally parallel with one another and extend lengthwise along the respective heat spreaders 92. The heat pipes 90 also terminate at opposite end portions 94 and 96 of their respective heat spreaders 92. As a result, the heat pipes 90 are at least substantially or entirely contained within dimensions of the respective heat spreaders 92. The illustrated heat pipes 90 also have a rectangular cross section 98 and a flat interior surface 100 generally flush with a flat interior surface 102 of the respective heat spreaders 92. As a result, the illustrated heat pipes 90 and heat spreaders 92 contact the memory 14 in a flush manner to improve heat transfer away from the memory 14 and more uniformly distribute the heat along the heat spreaders 92. In the illustrated embodiment, the memory 14 is a dual in-line memory module (DIMM) having a plurality of integrated memory circuits or chips 104 disposed on opposite sides 106 and 108 of a circuit board 110. Thus, the inner surface 100 of the heat pipes 90 and the inner surface 102 of the heat spreaders 92 contact the chips 104 in a generally flush manner lengthwise along the dual in-line memory module (DIMM). The circuit board 110 also includes an edge connector 112 having a series of contact pads 114 disposed on the opposite sides 106 and 108. These contact pads 114 of the edge connector 112 are configured to mate with a female receptacle on the motherboard 22 of FIG. 1 or another electronic device.

Figure 4:
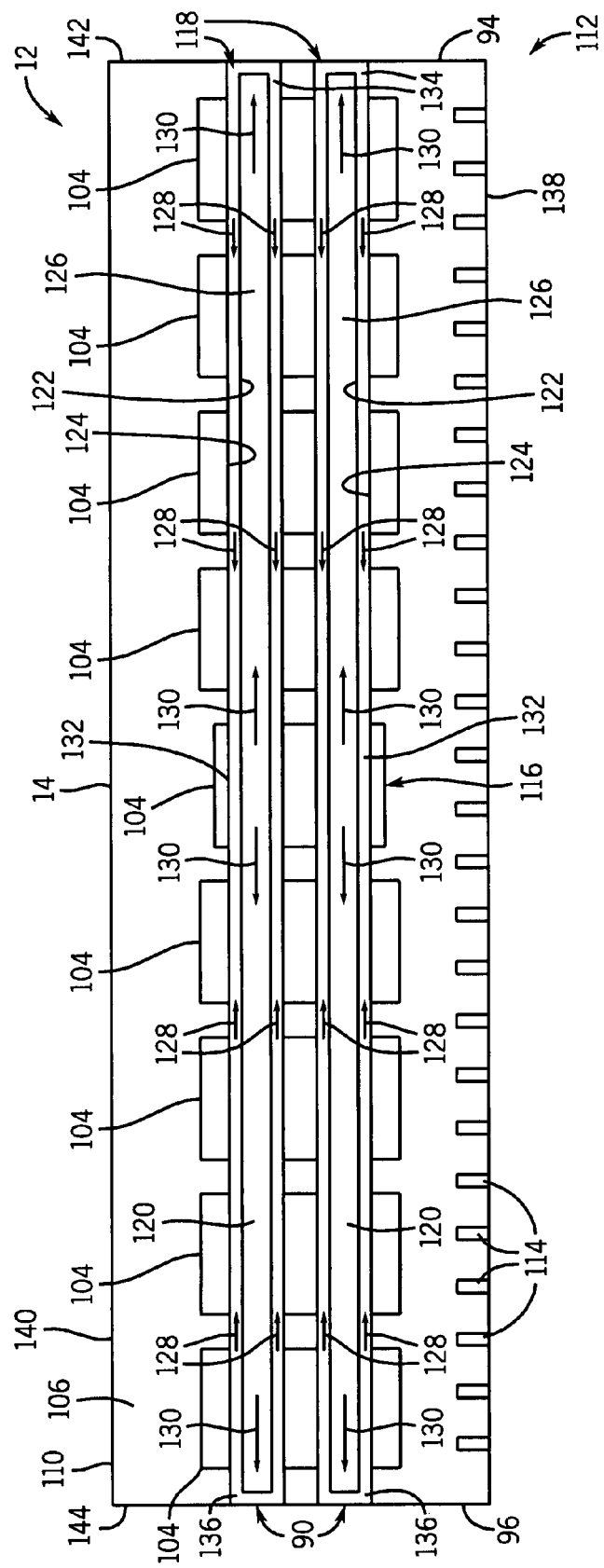
FIG. 4 is a side view of an embodiment of an in-line memory module having a pair of heat pipes disposed along a series of memory chips.

FIG. 4 is a side view of an embodiment of the low profile in-line memory assembly 12 as illustrated in FIG. 3, wherein the heat spreaders 92 are removed and the heat pipes 90 are shown in cross section to illustrate the evaporative cooling along the memory 14. As illustrated, the memory chips 104 are coupled to the circuit board 110 in a line from the first end portion 94 to the second end portion 96, wherein the line is generally parallel with the edge connector 112. In certain embodiments, the memory chips 104 include random access memory chips. In one embodiment, a central chip 116 is a buffer memory module, such as an advanced memory buffer (AMB) chip. Thus, an embodiment of the memory 14 may be described as a fully buffered dual in-line memory module (FBDIMM).

As illustrated in FIG. 4, each of the heat pipes 90 includes an elongated enclosure 118 containing a working fluid 120. Each elongated enclosure 118 includes a wick material 122 disposed along an interior wall 124 about a central space 126 of the elongated enclosure 118. The working fluid 120 includes a liquid 128 and a vapor 130 disposed within the elongated enclosure 118, wherein the liquid 128 is disposed within the wick material 122 and the vapor 130 is disposed within the central space 126. The working fluid 120 is configured to absorb heat by evaporation of the liquid 128 into the vapor 130 and to release heat by condensation of the vapor 130 into the liquid 128 at different portions within the elongated enclosure 118. Specifically, in relatively hot regions of the heat pipes 90, the liquid 128 evaporates into the vapor 130, which then travels lengthwise along the central space 126 to a relatively cooler portion of the heat pipe 90. At the relatively cooler portion of the heat pipe 90, the vapor 130 then condenses into the liquid 128, which in turn circulates through the wick material 122 back toward the hot region within the heat pipe 90.

In the illustrated embodiment, the hot region may correspond to the position of the buffer chip 116. The buffer chip 116 may generate substantially more heat than the other memory chips 104, thereby causing much of the heat to be distributed from a central region 132 within the heat pipes 90 outwardly toward the opposite end portions 94 and 96. Specifically, the heat is absorbed in the central region 132 by evaporation of the liquid 128 into the vapor 130. The vapor 130 circulates through the central space 126 of the elongated enclosure 118 from the central region 132 in opposite directions outwardly toward opposite end regions 134 and 136 of the respective heat pipes 90 (e.g., in a diverging manner), as illustrated by arrows 130. At the opposite end regions 134 and 136, the vapor 130 then condenses into the liquid 128, which then travels through the wick material 122 from the opposite end regions 134 and 136 toward the central region 132 in a generally converging manner. Upon reaching the central region 132, the cycle repeats as the liquid 128 evaporates into the vapor 130 to absorb more heat. Thus, in the illustrated embodiment, the working fluid 120 circulates in two circular paths between the central region 132 and the opposite end regions 134 and 136. In other words, the vapor 130 diverges from the central region 132 toward the opposite end regions 134 and 136, while the liquid 128 converges from the opposite end regions 134 and 136 toward the central region 132. In this manner, the evaporative cooling of the heat pipes 90 is able to distribute the heat more uniformly along the length of the memory 14.

As illustrated in FIGS. 3 and 4, the heat pipes 90 are substantially contained within the form factor or dimensions of the memory 14 and the heat spreaders 92. For example, the heat pipes 90 do not extend below a bottom edge 138 or an opposite top edge 140 of the circuit board 110. In fact, the illustrated heat pipes 90 are parallel to both the bottom and top edges 138 and 140. In addition, the illustrated heat pipes 90 do not extend beyond opposite ends 142 and 144 of the circuit board 110 or the opposite end portions 94 and 96 of the pair of heat spreaders 92. Although some embodiments may extend the heat pipes 90 an insubstantial amount beyond the bottom and top edges 138 and 140, the opposite ends 142 and 144, and the opposite end portions 94 and 96, the illustrated heat pipes 90 are completely contained within the standard dimensions of the memory 14 and the heat spreaders 92. As a result, the overall memory assembly 12 has a relatively low profile configuration without any protruding cooling members that could potentially prevent the memory assembly 12 from being mounted in a conventional memory slot within a computer, such as a laptop, a server, and so forth.

The illustrated heat pipes 90 also have a straight geometry relative to the bottom and top edges 138 and 140. Thus, the heat pipes 90 extend linearly along all of the memory chips 104 disposed on the circuit board 110, thereby providing a more uniform heat distribution from the memory chips 104 to the heat spreaders 92. In this manner, the heat pipes 90 may reduce the likelihood of any undesirably high temperatures along the memory 14, thereby improving the performance, reliability, and life of the memory assembly 12. The low profile configuration of the memory assembly 12 is particularly advantageous in dense computers, such as laptops and blade servers, wherein space may not be available for any type of external or protruding cooling solution. However, in certain embodiments, the heat pipes 90 may have a different geometry, configuration, and so forth. For example, the heat pipes 90 may have a non-linear, non-parallel, and protruding geometry relative to the memory 14. In one alternative embodiment, the heat pipes 90 may extend outwardly toward another cooling solution, such as a heat sink, a fan, or a combination thereof. However, as noted above, the illustrated embodiments have a low profile configuration, which is particularly advantageous for dense computing systems.

Figure 5:
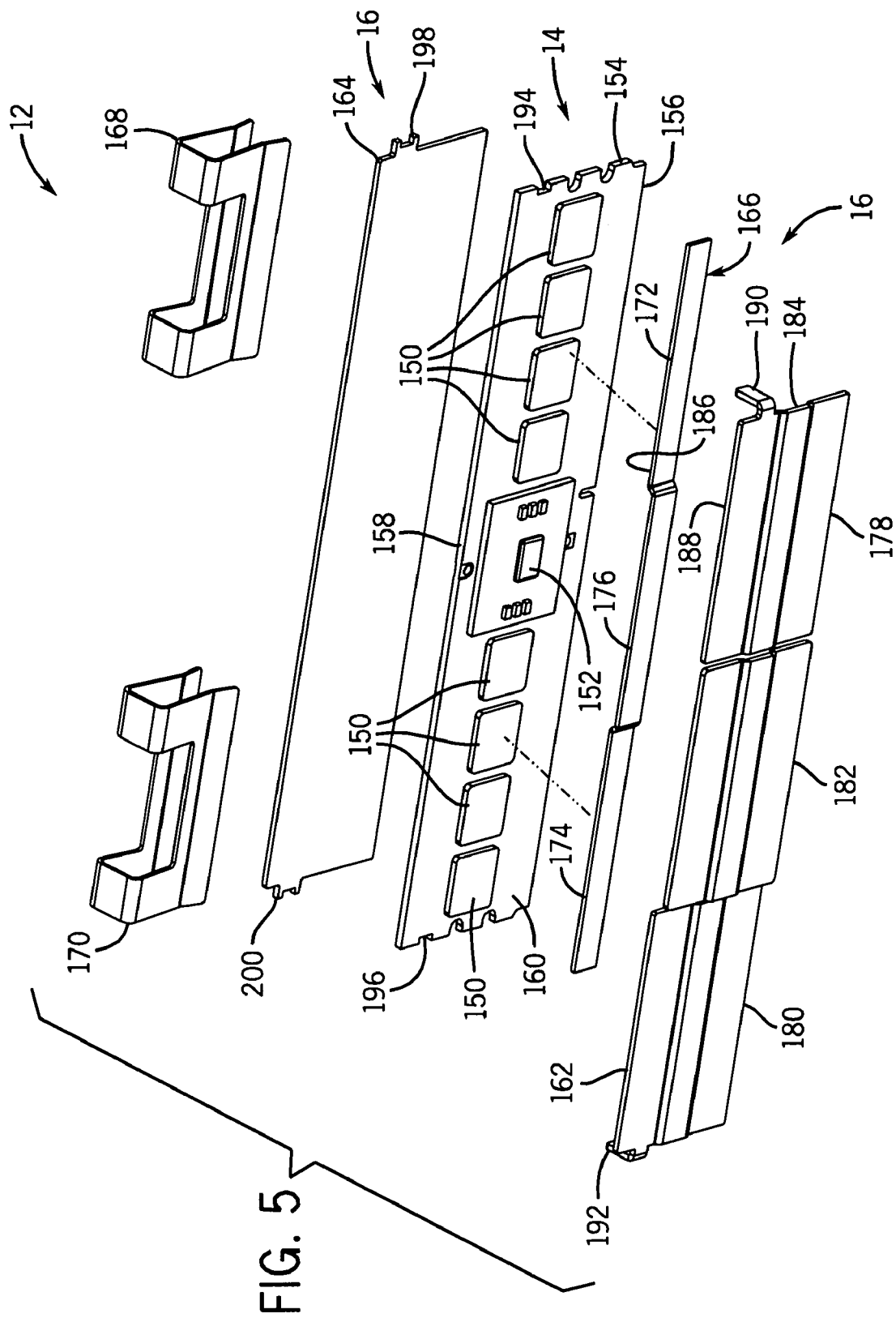
FIG. 5 is an exploded perspective view of an embodiment of a low profile in-line memory assembly having a heat pipe with a variable height configured to conform with varying heights of memory chips disposed along an in-line memory module.

FIG. 5 is an exploded perspective view of an embodiment of the low profile in-line memory assembly 12 as illustrated in FIGS. 1 and 2, wherein the evaporative cooling modules 16 have variable heights configured to conform to varying heights of the memory 14. Specifically, the illustrated memory 14 includes a plurality of in-line random access memory (RAM) chips 150 and a central advanced memory buffer (AMB) chip 152 disposed along a circuit board 154. The illustrated circuit board 154 also include an edge connector 156, wherein the memory chips 150 and the buffer chip 152 are generally parallel with the edge connector 156 and an opposite edge 158 of the circuit board 154. In the illustrated embodiment, the buffer chip 152 extends to a relatively greater height than the memory chips 150 on a face 160 of the circuit board 154.

The illustrated evaporative cooling module 16 includes a front heat spreader 162, a rear heat spreader 164, a heat pipe 166, and a pair of retention clips 168 and 170. The heat pipe 166 has a generally flat geometry with a rectangular cross section, wherein the heat pipe 166 has variable heights configured to conform with the variable heights of the memory chips 150 and the buffer chip 152. Specifically, the heat pipe 166 includes outer sections 172 and 174 disposed about a mid section 176, wherein the mid section 176 is raised to a greater height than the outer sections 172 and 174. As a result, the outer sections 172 and 174 of the heat pipe 166 can directly engage all of the memory chips 150, while the mid section 176 of the heat pipe 166 can engage the buffer chip 152 at the relatively greater height relative to the chips 150. Moreover, the flat geometry of the heat pipe 166 increases the surface area of the heat pipe 166 contacting the memory chips 150 and the buffer chip 152. In alternative embodiments, the heat pipe 166 may have a greater width to accommodate the dimensions of the memory chips 150 and the buffer chip 152. Moreover, the heat pipe 166 may be supplemented with one, two, three, or more additional heat pipes in a generally parallel arrangement similar to the embodiment discussed above with reference to FIGS. 3 and 4. In addition, a similar arrangement may be disposed on an opposite face of the circuit board 154.

Similar to the heat pipe 166, the front heat spreader 162 has a variable height configured to conform with the variable heights of the memory chips 150 relative to the buffer chip 152. As illustrated, the front heat spreader 162 includes outer sections 178 and 180 disposed about a mid section 182, wherein the mid section 182 extends to a height relatively greater than the height of the outer sections 178 and 180 when mounted onto the circuit board 154. In the illustrated embodiment, the heights of the sections 178, 180, and 182 of the heat spreader 162 generally correspond to the heights of the sections 172, 174, and 176 of the heat pipe 166. The heat spreader 162 also includes a channel or groove 184 extending lengthwise along the heat spreader 162 through the sections 178, 180, and 182. The channel 184 has dimensions configure to receive the heat pipe 166 within the heat spreader 162, such that an inner side 186 of the heat pipe 166 is at least substantially or entirely flush with an inner side 188 of the heat spreader 162. In this manner, the flush arrangement of the heat pipe 166 with the heat spreader 162 enables both of these components to contact the memory chips 150 and the buffer chip 152.

The illustrated heat spreader 162 also includes a pair of outer tabs 190 and 192 extending in a generally perpendicular direction relative to the outer sections 178 and 180, respectively. These tabs 190 and 192 are configured to extend through receptacles 194 and 196 in the circuit board 154 and also through receptacles 198 and 200 in the rear heat spreader 164. During assembly, the engagement of these tabs 190 and 192 with the corresponding receptacles 194, 196, 198, and 200 ensures that the heat spreaders 162 and 164 are properly positioned about opposite sides of the circuit board 154. The illustrated heat spreader 164 does not include any heat pipes or vapor chambers. However, in other embodiments, the heat spreader 164 may include one or more heat pipes, vapor chambers, or a combination thereof. Upon assembling the heat pipe 166 and the heat spreaders 162 and 164 about the circuit board 154, the retention clips 168 and 170 may be disposed downwardly about the components to compressively contain them together in the assembly.

FIG. 6 is a perspective view of the low profile in-line memory assembly 12 having the heat pipe 166 and the heat spreaders 162 and 164 sandwiched about the circuit board 154 with the retention clips 168 and 170 secured about the sandwich like assembly. As illustrated in FIG. 6, the memory assembly 12 has a relatively low profile or small form factor, which can be easily mounted in a variety of dense computer systems. In other words, the heat pipe 166 does not extend outside the dimensions of the circuit board 154 and the heat spreaders 162 and 164. As a result, the heat pipe 166 does not complicate the mounting of the memory assembly 12.

FIG. 7 is top view of the memory assembly 12 further illustrating variable heights of the heat pipe 166 (within the front heat spreader 162) relative to the memory chips 150 and the buffer chip 152. As illustrated, the memory chips 150 are disposed on both sides of the circuit board 154, while the buffer chip 152 is disposed on only one side of the circuit board 154. As a result, the illustrated heat spreader 164 does not have a variable height, whereas the heat spreader 162 has a variable height to accommodate the greater height of the buffer chip 152 relative to the memory chips 150. In alternative embodiments, the memory chips 150 may be disposed at other variable heights with or without the buffer chip 152, and the heat spreaders 162 and 164 along with one or more of the heat pipes 166 may have other variable heights to accommodate the memory chips 150.

FIG. 8 is an end view of the memory assembly 12 further illustrating the retention clips 168 and 170 compressively disposed about the sandwich like arrangement of the circuit board 154, the heat spreaders 162 and 164, and the heat pipe 166. In the illustrated embodiment, the retention clips 168 and 170 have opposite v-shaped retention portions 202 and 204, which are generally focused on the vicinity of the memory chips 150 and the buffer chip 152. In other words, the retention portions 202 and 204 compress the heat spreaders 162 and 164 along with the heat pipe 166 directly onto the memory chips 150 and the buffer chip 152. In this manner, the retention clips 168 and 170 ensure that the heat spreaders 162 and 164 and the heat pipe 166 fully engage the memory chips 150 and 152 to maximize the contacting surface area for heat transfer.

FIG. 9 is an exploded perspective view of another embodiment of the memory assembly 12 as illustrated in FIGS. 5-8, wherein the heat pipe 166 and the front heat spreader 162 is replaced with a vapor chamber 210. The illustrated vapor chamber 210 has dimensions similar to those of the combination of the heat pipe 166 with the front heat spreader 162. In other words, the vapor chamber 210 has a length 212 and a width 214 substantially the same as the face 160 of the circuit board 154 and the front heat spreader 162 illustrated in FIGS. 5-8. In this manner, the vapor chamber 210 maximizes the evaporative cooling solution within the general form factor or footprint of the memory assembly 12.

As illustrated, the vapor chamber 210 includes outer sections 216 and 218 disposed about a mid section 220, wherein the mid section 220 has a height relatively greater than the height of the outer sections 216 and 218. Again, the greater height of the mid section 220 is configured to conform with the greater height of the buffer chip 152 relative to the memory chips 150 disposed on the circuit board 154. Similar to the heat pipe 166 illustrated in FIGS. 5-8, the vapor chamber 210 has a generally flat geometry with a rectangular cross section, such that an inner side 222 of the vapor chamber 210 has a generally flat engagement surface to maximize the contacting surface area with the memory chips 150 and the buffer chip 152.

When assembled with the circuit board 154 and the rear heat spreader 164, the vapor chamber 210 generally does not extend outside the perimeter of the circuit board 154. In other words, the vapor chamber 210 does not substantially extend above a top edge 224 or beyond opposite ends 226 and 228 of the circuit board 154. Advantageously, this small form factor of the vapor chamber 210 enables the overall memory assembly 12 to fit within any standard space for memory within a laptop, a server, and so forth.

What is claimed is:

1. A system, comprising:
    an in-line memory module comprising a plurality of memory circuits disposed on a circuit board, wherein the circuit board comprises an edge connector comprising a plurality of contact pads and the plurality of memory circuits including a first memory circuit having a first height and a second memory circuit having a second height;
    a heat spreader disposed along the plurality of memory circuits external to the in-line memory module, the heat spreader comprising a channel formed therein; and
    a heat pipe, a vapor chamber, or a combination thereof, located at least partially within the channel and extending along the heat spreader from a third memory circuit centrally located on the in-line memory module to the first and second memory circuits outwardly located at distal ends of the in-line memory module, the heat pipe, the vapor chamber, or the combination thereof, having a height that varies to conform to the first and second heights of the memory circuits.

2. The system of claim 1, wherein the in-line memory module comprises a DIMM or a SIMM.

3. The system of claim 1, wherein at least one of the plurality of memory circuits or the third memory circuit comprise an advanced memory buffer chip.

4. The system of claim 1, wherein the plurality of memory circuits comprise random access memory chips.

5. The system of claim 1, wherein the heat pipe, the vapor chamber, or the combination thereof, is at least substantially contained within the heat spreader.

6. The system of claim 1, wherein the heat pipe, the vapor chamber, or the combination thereof, terminates at opposite end regions of the heat spreader.

7. The system of claim 1, wherein the heat pipe, the vapor chamber, or the combination thereof, does not extend substantially beyond an edge region of the circuit board opposite from the edge connector.

8. The system of claim 1, comprising a clip disposed about the in-line memory module, the heat spreader, and the heat pipe, the vapor chamber, or the combination thereof.

9. The system of claim 1, wherein the in-line memory module is coupled to another circuit board via the edge connector.

10. The system of claim 1, comprising a computer having the in-line memory module, the heat spreader, and the heat pipe, the vapor chamber, or the combination thereof.

11. The system of claim 1, wherein the in-line memory module is disposed between the heat spreader and a second heat spreader, the heat spreader and the second heat spreader disposed on opposing sides of the in-line memory module.

12. The system of claim 1, wherein the heat spreader wraps around the in-line memory module, the in-line memory module being disposed at least partially within the heat spreader.

13. A system, comprising:
    a heat spreader configured to mount external to an in-line memory module in contact with each of a plurality of memory circuits of the in-line memory module; and
    an evaporative cooling system at least substantially contained within dimensions of the heat spreader and configured to make contact with each of the plurality of memory circuits when the heat spreader is mounted to the in-line memory module, the evaporative cooling system extending along the heat spreader from a first chip centrally located on the in-line memory module to the memory circuits outwardly located at distal ends of the in-line memory module, the evaporative cooling system comprising a heat pipe, or a vapor chamber, or a combination thereof, having a variable height configured to conform to memory chips having varying heights on the in-line memory module.

14. A system, comprising:
    a heat spreader configured to mount external to an in-line memory module in contact with each of a plurality of memory circuits of the in-line memory module; and
    an evaporative cooling system at least substantially contained within dimensions of the heat spreader and configured to make contact with each of the plurality of memory circuits when the heat spreader is mounted to the in-line memory module, the evaporative cooling system extending along the heat spreader from a first chip centrally located on the in-line memory module to the memory circuits outwardly located at distal ends of the in-line memory module, the evaporative cooling system comprising a flat vapor chamber extending lengthwise along the heat spreader.

15. The system of claim 14, wherein said plurality of memory circuits comprise a plurality of random access memory circuits arranged in a line along a circuit board, wherein the circuit board comprises an edge connector having contact pads arranged parallel to the line.

16. The system of claim 14, wherein the evaporative cooling system comprises one or more heat pipes, one or more vapor chambers, or a combination thereof.

17. The system of claim 14, wherein the evaporative cooling system comprises a plurality of parallel heat pipes extending lengthwise along the heat spreader.

18. The system of claim 14, comprising another heat spreader configured to mount to the in-line memory module on an opposite side from the heat spreader, wherein the other heat spreader comprises another evaporative cooling system.

19. A system, comprising:
    a heat spreader to mount adjacent to an external surface of an in-line memory module, said heat spreader comprising a channel formed therein;
    an evaporative cooling system located at least partially within the channel and comprising an elongated enclosure to contact a plurality of memory circuits arranged in a line on the external surface of the in-line memory module;

a wick material disposed along an interior wall about a central space of the elongated enclosure; and a working fluid comprising a liquid and a vapor disposed within the elongated enclosure, wherein the working fluid is to absorb heat by evaporation of the liquid into the vapor adjacent a chip centrally located on the in-line memory module and to release heat by condensation of the vapor into the liquid at different portions within the elongated enclosure adjacent to ones of the memory circuits outwardly located at distal ends of the in-line memory module, the liquid is to circulate through the wick material toward the chip centrally located on the in-line memory module, and the vapor is to circulate through the central space toward the ones of the memory circuits outwardly located at the distal ends of the in-line memory module.

20. The system of claim 19, wherein the elongated enclosure comprises a variable height configured to conform to varying heights of the plurality of memory circuits arranged on the in-line memory module.

* * * * *